United States Patent [19]

Sugimoto et al.

[11] Patent Number: 5,255,155
[45] Date of Patent: Oct. 19, 1993

[54] STRUCTURE OF ELECTRIC CIRCUIT PANEL FOR INSTRUMENT PANEL OF AUTOMOBILE AND METHOD FOR FORMING THE SAME

[75] Inventors: Tetsuo Sugimoto, Osaka; Junichi Kojima, Aichi; Yoshitsugu Tsuji, Mie; Tetsuo Yamamoto, Nara; Yukio Kominami, Mie, all of Japan

[73] Assignees: Sumitomo Wiring Systems, Ltd., Mie; Sumitomo Electric Industries, Ltd., Osaka, both of Japan

[21] Appl. No.: 761,529

[22] Filed: Sep. 18, 1991

[30] Foreign Application Priority Data

| Sep. 19, 1990 | [JP] | Japan | 2-250946 |
| Sep. 19, 1990 | [JP] | Japan | 2-250947 |
| Feb. 22, 1991 | [JP] | Japan | 3-050825 |
| Jul. 8, 1991 | [JP] | Japan | 3-273008 |

[51] Int. Cl.$^5$ ............................................. H05K 1/00
[52] U.S. Cl. ........................................ 361/749; 361/752; 361/828; 174/72 A; 174/254; 439/67; 439/77
[58] Field of Search ............... 361/380, 331, 392, 398, 361/399, 397, 415, 428; 174/72 A, 72 TR, 268, 254; 439/91, 77, 67

[56] References Cited

U.S. PATENT DOCUMENTS

| 3,009,010 | 11/1961 | Stearns et al. | 174/72 |
| 4,025,896 | 5/1977 | Hintze et al. | 240/8.16 |
| 4,403,818 | 9/1983 | Kleinbohl | 339/10 |
| 4,974,121 | 11/1990 | Masuko et al. | 361/428 |

FOREIGN PATENT DOCUMENTS

| 281376 | 9/1988 | European Pat. Off. |
| 8105649 | 8/1981 | Fed. Rep. of Germany |
| 3023905 | 1/1982 | Fed. Rep. of Germany |
| 3903229 | 8/1990 | Fed. Rep. of Germany |
| 2201553 | 4/1974 | France |
| 61-80711 | 4/1986 | Japan |
| 61-80712 | 4/1986 | Japan |
| 61-27107 | 12/1986 | Japan |
| 1444088 | 7/1976 | United Kingdom |

Primary Examiner—Leo P. Picard
Assistant Examiner—Young S. Whang
Attorney, Agent, or Firm—Sughrue, Mion, Zinn, Macpeak & Seas

[57] ABSTRACT

A flexible flat conductor wiring board (5) having required electric circuits is affixedly disposed on an instrument cluster (2) of an instrument panel portion of an automobile so as to be connected to switches and instruments (3A to 3E) that are provided on the instrument cluster (2) in groups so that an electric circuit is formed. Electric functioning components needed to carry out electric control of the switches and instruments are dispersedly provided on the end portions of centrally arranged switches and instruments or provided on the wiring board (5) with the electric control functions being incorporated in the electric circuits of the instrument cluster (2). Switches and instruments (3A to 3E) are provided, and electric circuits for the switches and instruments (3A to 3E) are provided so as to make the instrument cluster (2) an independent electric component. The instrument cluster (2) as an independent electric component is mounted on the instrument panel portion 1 of an automobile.

11 Claims, 11 Drawing Sheets

STRUCTURE OF ELECTRIC CIRCUIT PANEL FOR INSTRUMENT PANEL OF AUTOMOBILE AND METHOD FOR FORMING THE SAME

BACKGROUND OF THE INVENTION

1. Field of the Invention

The present invention relates to a structure of an electric panel circuit for an instrument panel of an automobile and a method for forming the same.

2. Statement of the Prior Art

A conventional electric circuit in an instrument panel of an automobile is formed such that a wiring harness formed in accordance with a predetermined electric circuit is manually laid out on the body of the automobile or on the dashboard of the instrument panel portion, and that the connectors of the wiring harness are then connected to connectors of switches and instruments.

However, in recent years, electronics have been used more and more in automobiles so as to have more sophisticated electric control, and the number of switches and instruments provided in the instrument panel portion for a driver has been remarkably increased, with the electric circuits becoming increasingly more complicated. Wiring harnesses used for forming electric circuits tend to become larger and heavier, and this tendency is expected to grow further in the future.

In accordance with the afore-mentioned means for laying out a wiring harness, a wiring harness comprising bundles of electric wires tied together that is long and large and is branched in many ways is manually laid out and fastened by means of clamps, and afterwards the connectors of the wiring harness need to be connected to connectors of switches and instruments. This requires space for laying out the wiring harness and for connecting connectors together.

However, as wiring harnesses become larger and more complicated, space available inside the dashboard becomes limited, which make the work of laying out a wiring harness and connecting connectors together very inefficient and difficult.

Furthermore, in accordance with the above means for forming a circuit, since electricity conduction tests on a group of electric circuits in the instrument panel portion can be carried out only when the electric circuits have been attached to the body of an automobile, when a failure in electricity conduction due to improper connection of connectors is found, large-scaled disassembling work is needed for repair. Thus, in the above means, there are problems of unstableness in quality (a risk of improper connection of connectors) based on the connector connecting means and large-scaled rectifications of failures. Moreover, the fact that it is not possible to produce electric circuits for an instrument panel portion in modules negative affects performance and productivity.

As electronics are used more and more in the instrument panel portion and electric circuits become more complicated, the difficulties inherent in the above-mentioned means for laying out a wiring harness will increase correspondingly, and the following problems are expected to result: production of defective articles due to improper connection of connectors; difficulties in securing space for laying out a wiring harness and connecting connectors together; and problems in the quality of wiring harnesses and the cost therefor due to the complication of wiring harnesses. In order to cope with this, a technical innovation in the means for constructing an electric circuit for the instrument panel portion of an automobile is strongly demanded in the relevant field.

SUMMARY OF THE INVENTION

An object of the present invention is to simplify the structure of electric circuits for switches and instruments provided in the instrument panel portion of an automobile, to save space for the electric circuits, and to improve the forming performance and productivity, as well as the quality thereof.

In order to attain the above object, an electric circuit panel structure for an instrument panel portion of an automobile according to the present invention is constructed such that a flexible flat conductor wiring board having predetermined electric circuits is provided on an instrument cluster of the instrument panel portion of the automobile so that switches and instruments of the instrument cluster are connected to the flexible flat conductor wiring board.

The electric panel circuit structure of the present invention may be constructed such that in the electric circuits of the switches and instruments of the instrument panel portion of the automobile, a control unit for centrally controlling the electric control functions of the switches and instruments is provided in the vicinity of the switches and instruments so that the control unit is incorporated therein for connection.

The electric circuit panel structure of the present invention may be constructed such that in the electric circuits of the switches and instruments of the instrument panel portion of the automobile, electric functioning components needed to control the electric circuits are provided and dispersed at the end portions of the electric circuits of the switches and instruments that are disposed in groups, and that an electric control substrate is provided integrally with the end portions, so that the substrate is incorporated into the electric circuits for connection.

The electric circuit panel structure of the present invention may be constructed such that in the electric circuits of the switches and instruments of the instrument panel portion of the automobile, a flexible flat conductor wiring board having predetermined electric circuits and provided with the electric functioning components needed to carry out electric control of the electric circuits may be mounted on the instrument cluster of the instrument panel portion.

A method for forming a structure of an electric circuit panel according to the present invention comprises the steps of, in the electric circuits of the switches and instruments of the instrument panel portion of the automobile, mounting groups of switches and instruments on an instrument cluster of an instrument panel portion so as to establish electric circuits for the switches and instruments, thereby making the instrument cluster an independent electric component, and of attaching the instrument cluster to a dashboard of the instrument panel portion.

In the present invention, predetermined switches and instruments are mounted on the instrument cluster of the instrument panel portion of the automobile so that electric circuits for the switches and instruments are formed, and in addition thereto a connecting portion to a primary-side electric circuit of the instrument panel portion may be provided, thereby making it possible to make the instrument cluster as an independent electric component.

On the basis of the afore-mentioned basic structures and method, the following modifications may be carried out: the flexible flat conductor wiring board may be affixed to the instrument cluster; the wiring board may be direct connected to the switches and instruments without any connectors employed; the electric circuit portions of the switches and instruments may be formed into a wiring board of a rigid sheet; and the electric circuits may be formed of flexible flat conductor wiring boards so as to function as the above control unit or electric control substrate. There is a case in which the switches and instruments may be connected to one another so that multiple communications are possible therebetween, and in such a case, a flexible flat conductor wiring board is used and may be formed so as to have a curvature that coincides with the configuration of the wall surface of the instrument cluster.

In the present invention, the instrument cluster is a constituent component of the instrument panel portion of an automobile, which is a known member that surrounds switches and instruments provided in the panel. The switches and instruments involve switches, meters, a clock, pilot lamps, a radio, car audio equipment and so forth that are provided in the instrument panel portion of an automobile. The electric functioning components involve electric and electronic components such as ICs needed to carry out electric control in relation to timers, memories, operations and so forth for the switches and instruments. The flexible flat conductor wiring board involves a printed wiring board of a flexible sheet-like body in which electric circuits are printed and laid out, and a wiring board of a flexible sheet-like body in which conductors are laid out on the sheet body so as to form electric circuits.

In the present invention, when the flexible flat conductor wiring board is used, since a thin sheet-like flexible wiring board is placed on the instrument cluster in a recessed and/or raised fashion so as to form electric circuits, less space is required for electric circuits, and the weight of the entire electric circuits is reduced. Moreover, the flexible flat conductor wiring board provides advantages of easy formation of electric circuits (automatic formation of circuits is possible) and high reliability of the circuits (since there is no failure in wiring).

In a case in which direct connection is employed with no connector used, since there is no connector interposed, reliability in quality is improved (connection errors due to improper connection of connectors can be eliminated). Furthermore, in a case in which a rigid sheet-like wiring board is employed, resisting force against force applied when the switches and instruments are operated is secured, thereby making it possible to avoid the deformation of the wiring board.

Since the control unit having central electric control functions for the switches and instruments in the instrument panel portion of an automobile is incorporated, it is possible to have multi-functioning switches, to simplify the structure of the switches, and to establish multi-controlling by allowing the control unit to have electric control functions in relation to timers, memories, operations and so forth for the groups of switches and instruments, whereby the structure of the electric circuit can be remarkably simplified compared with an electric circuit employing a conventional single-function switch.

Since the electric control substrate having electric functioning components needed to carry out electric control of the switches and instruments is incorporated, and since the electric functioning components are mounted on the flexible flat conductor wiring board, as described above, it is possible to have multi-functioning switches, to simplify the structure of the switches, and to establish multi-controlling. Thus, it is possible to eliminate the overlap of the electric functioning components by causing the electric functioning components to organically operate in cooperation with each other, resulting in a simplified structure of the electric circuits.

In a case in which the flexible flat conductor wiring board is formed so as to have a curvature that coincides with the configuration of the wall surface of the instrument cluster, the wiring board can easily be secured to the instrument cluster. Since the instrument cluster on which the switches and instruments are mounted and in which electric circuits are formed is made to function as a separate independent electric component, and since the cluster is mounted on the instrument panel portion, electricity conduction tests can be performed on the cluster in advance, thereby making it possible to improve reliability in relation to electric conduction. In addition, it is also possible to produce clusters as an independent electric component in modules.

DETAILED DESCRIPTION OF THE PREFERRED EMBODIMENTS

Figure 1:
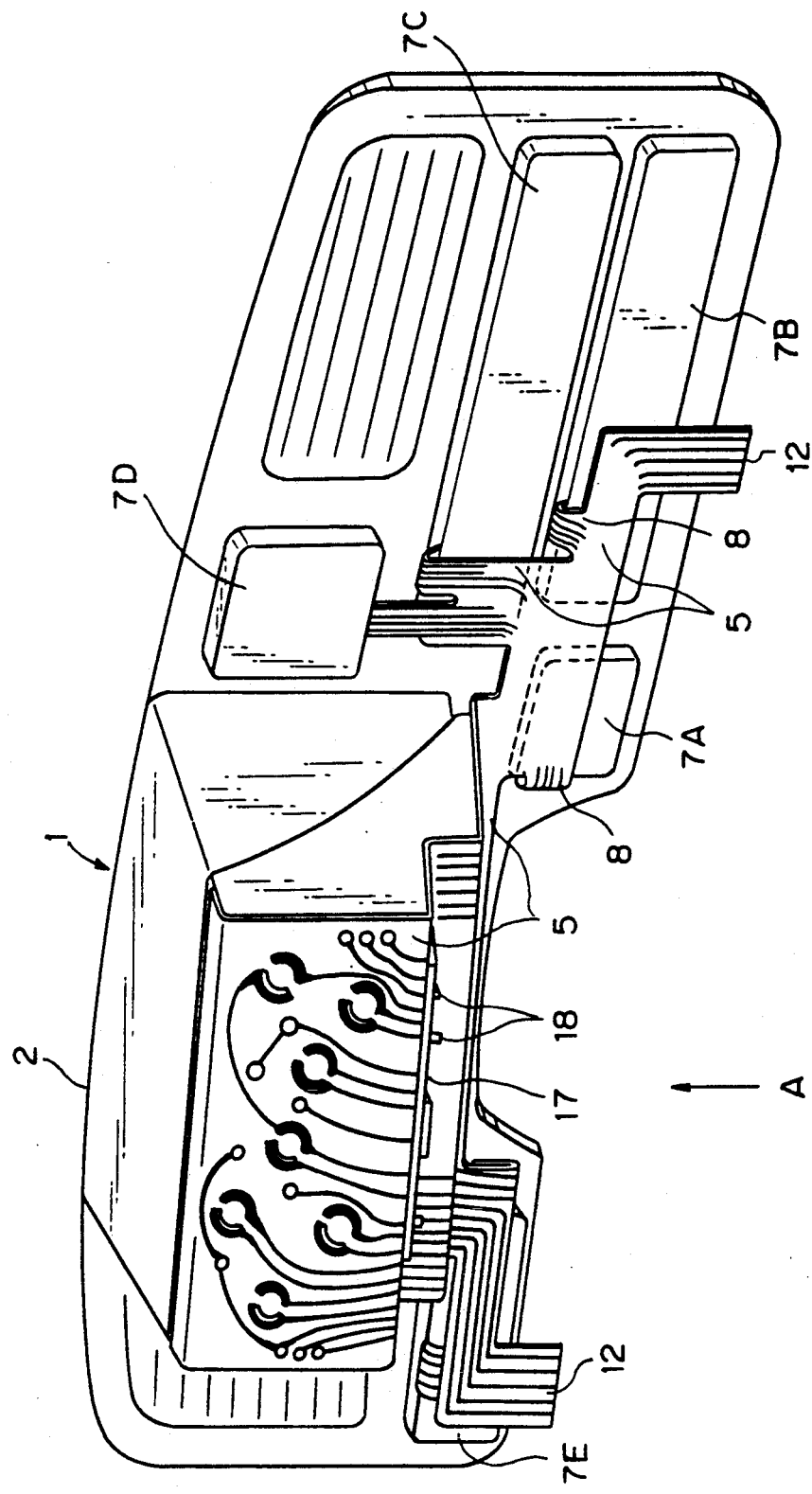
FIG. 1 is a perspective view showing a state in which first and second embodiments of an electric circuit structure according to the present invention are mounted on the back of an instrument panel portion of an automobile.

Referring to the drawings, embodiments of an electric circuit structure for an instrument panel portion of an automobile and a method for forming the same according to the present invention will be described.

Figure 2:
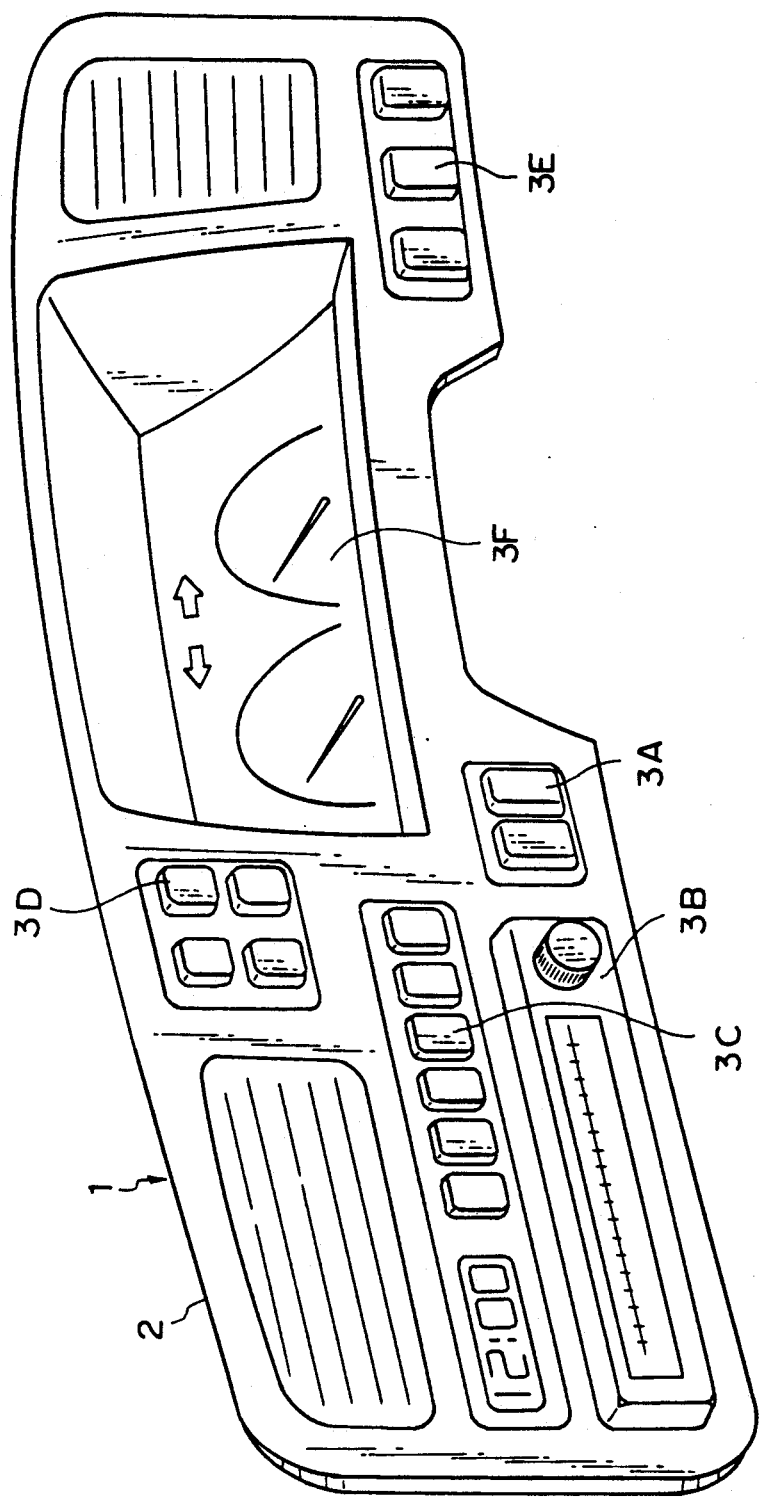
FIG. 2 is a perspective view of the front of the panel portion of FIG. 1.

First, referring to FIGS. 1 to 3, a first embodiment of the present invention will be described. Electric circuits for switches and instruments 3A to 3F are formed in an instrument cluster 2 (hereinafter, simply referred to as a cluster 2) on the front of which the switches and instruments 3A to 3F that are divided into groups are arranged. As shown in FIG. 1, a flexible flat conductor wiring board 5 (hereinafter, this flexible flat conductor wiring board being abbreviated to FFC 5) is mounted on the back of the cluster 2 in such a manner as to follow the recessed and/or raised wall surface of the cluster 2. FFC 5 may be affixed to the cluster by means of an adhesive or fixed thereto by means of clips and/or pins.

Rigid sheet-like wiring boards 7A to 7F in which only the end portions of circuits for the groups of the switches and instruments 3A to 3F are laid out in a printed manner on a rigid sheet 4 (FIG. 3) are mounted on the back of the cluster 2 group by group so as to be soldered to connecting portions 8 of FFC 5 for integral direct connection (with no connector used). In other words, referring to FIG. 3 showing one of them, the connecting portion 8 of FFC 5 affixed on the back of the cluster 2 is fastened around the end portion of the rigid sheet-like wiring board 7A having an electricity conducting portion 6 facing to the back of the cluster 2 so as to be soldered thereto for fixation, whereby the electricity conducting portions 6 of the connecting portion and the wiring board are direct connected to each other (with no connector used), a predetermined electric circuit being thus formed. A rubber switch 9, a key top 10 and a switch frame 11 are mounted on the end of the electricity conducting portion of the rigid sheet-like wiring board 7A in that order with the rubber switch 9 being direct connected to the electricity conducting portion 6.

The electric circuit of the cluster 2 are formed by FFC 5 and the rigid sheet-like wiring boards 7A to 7F, and the end 12 of FFC 5 of the cluster 2 is designed to be connected to the main lines of the instrument panel portion 1. This cluster 2 constitutes an independent electric component.

Figure 4:
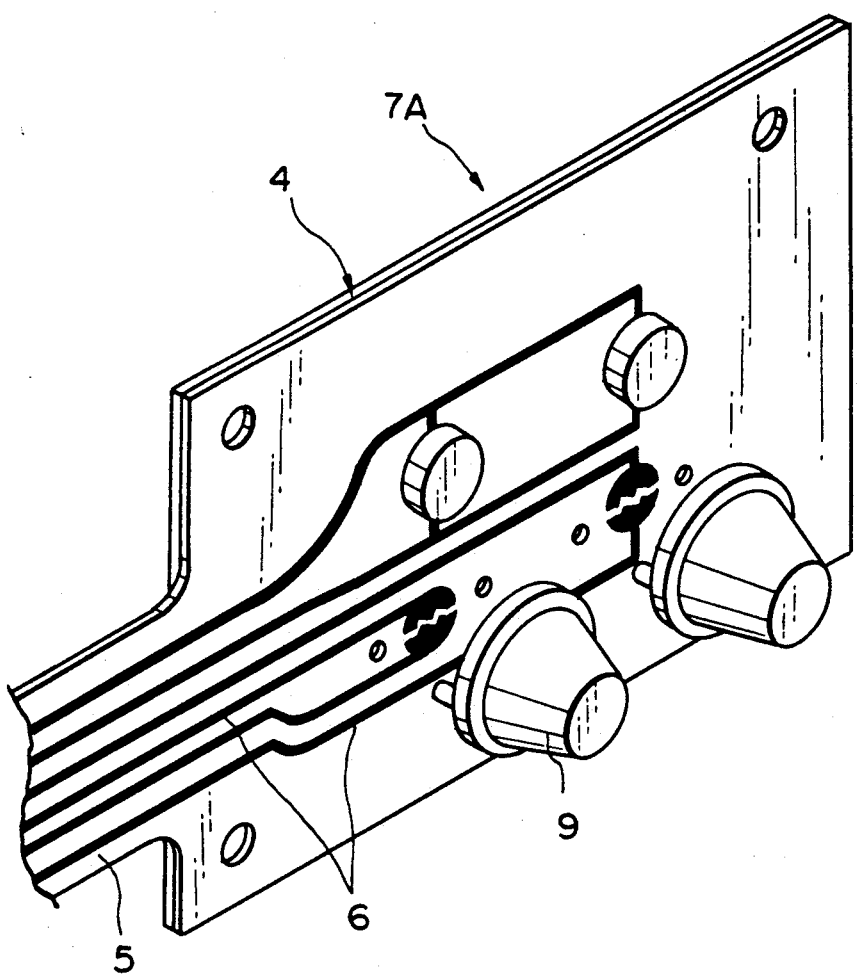
FIG. 4 is a partially enlarged perspective view showing a modification of the electric circuit structure of FIG. 3.
Figure 5:
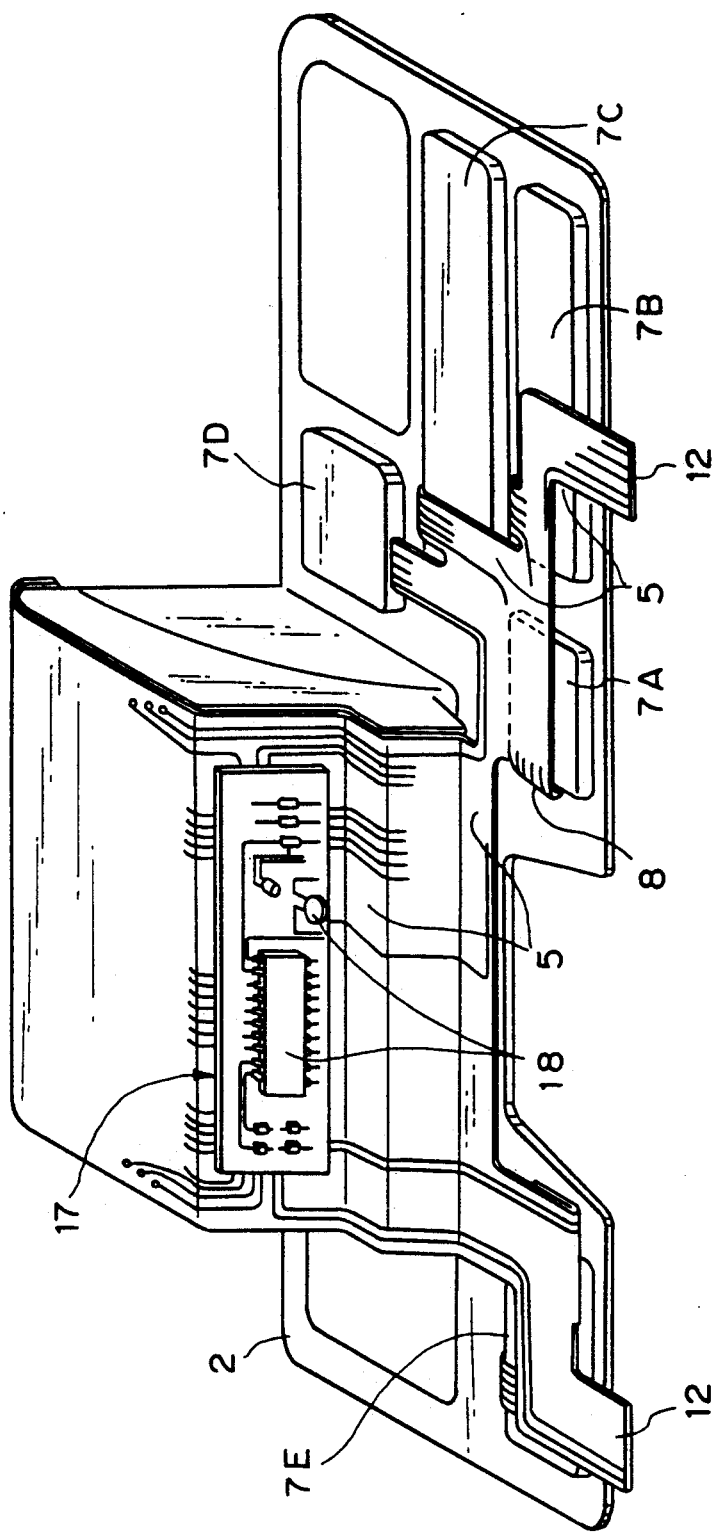
FIG. 5 is a bottom perspective view as seen in the direction indicated by an arrow A in FIG. 1, which shows the second embodiment of the present invention.

The rigid sheet-like wiring board 7 may be modified as shown in FIG. 4. In place of the above rigid sheet-like wiring board 7, the entire circuit including the end circuits of the switches and instruments 3 is formed into FFC 5, and only the end circuit portion is lined with the rigid sheet 4 so as to form a rigid sheet-like wiring board 7A. According to this embodiment, it is possible to eliminate the connection between FFC and the end circuit.

Next, referring to FIG. 1 and FIGS. 5 to 7, a second embodiment of the present invention will be described.

Figure 3:
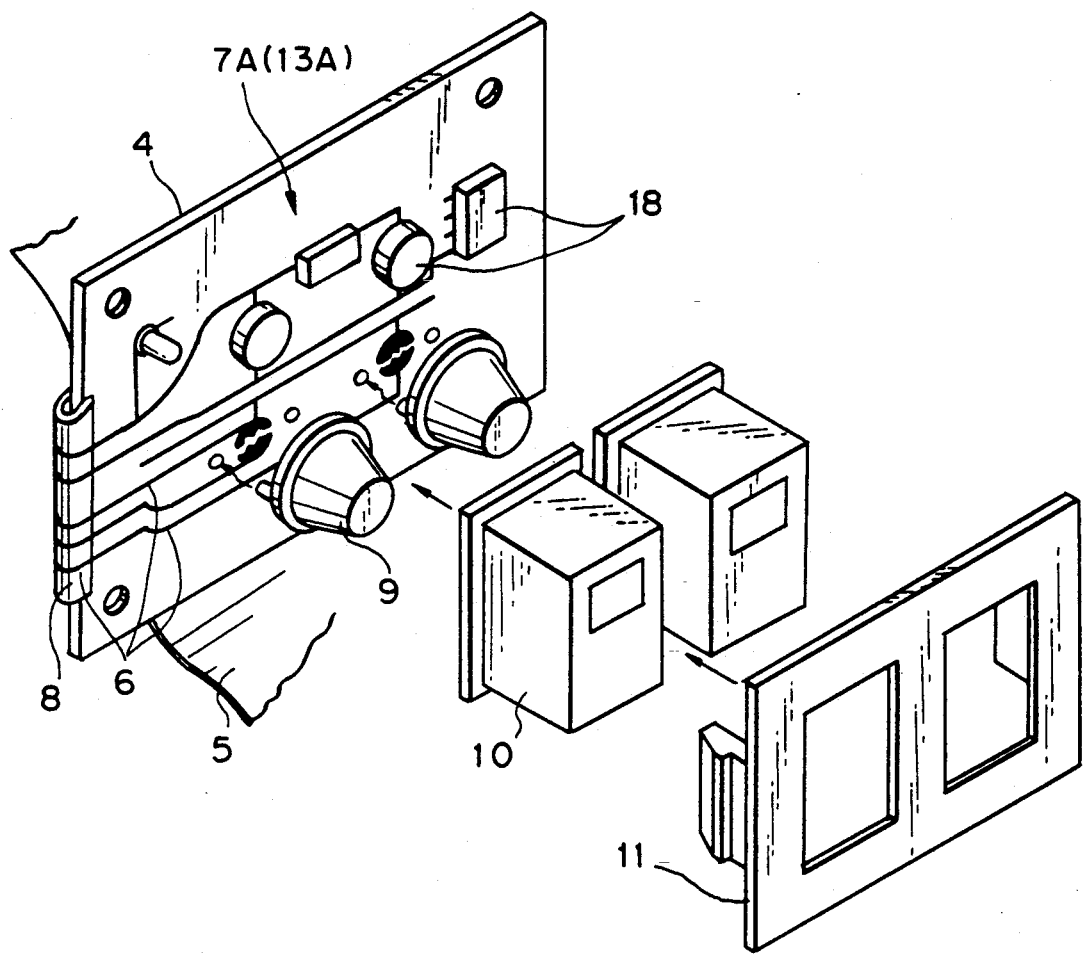
FIG. 3 is a partially enlarged perspective view of FIG. 1.
Figure 6:
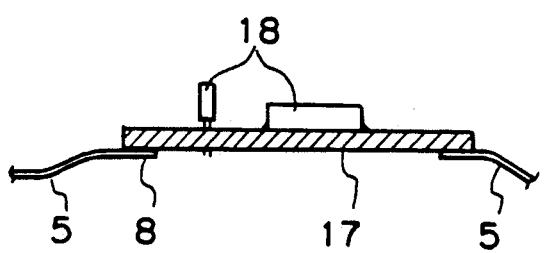
FIG. 6 is a front sectional view of a control unit.

The cluster 2 and switches and instruments 3A to 3E have the same structures as those shown in FIG. 3, and the connecting portion 8 of FFC 5 and the electricity conducting portions of the rigid sheet-like wiring boards 7A to 7E are connected together so as to form the respective electric circuits. A control unit 17 in which electric functioning components 18 for timers, memories, operations and so forth of the switches and instruments are centrally arranged is mounted on the back of the cluster 2 so as to be incorporated into and connected to the electric circuit of FFC 5 for integral connection. As shown in FIG. 6, the electricity conducting portion of the control unit 17 in which the electric functioning components such as ICs and the connecting portion 8 of FFC 5 are fixedly soldered for integral connection, and a control circuit for the electric functioning components 18 is incorporated into the circuit of FFC 5.

The control unit 17 has a control function of controlling the operation of the switches and instruments 3A to 3E based on input signals such as signals from the switches and instruments 3A to 3E, power source, external signals and signals needed to control the switches and instruments 3A to 3E when those signals are transferred thereto, and also has the electric functioning components 18 for timers, memories, operations and so forth that are needed for the control function. As a concrete example, with this control unit 17, it is possible to carry out a switching operation to obtain a self-hold type switching signal (a switch is on with a first press, the ON condition is maintained until a second press is performed, and the switch is off with the second press) by means of a simple push-switch, or it is possible to control the lighting and loading operations of indicator lamps (indicator lamps in the switches and meters), or it is possible to put the respective switches and loading times under multi-communication control.

Figure 7:
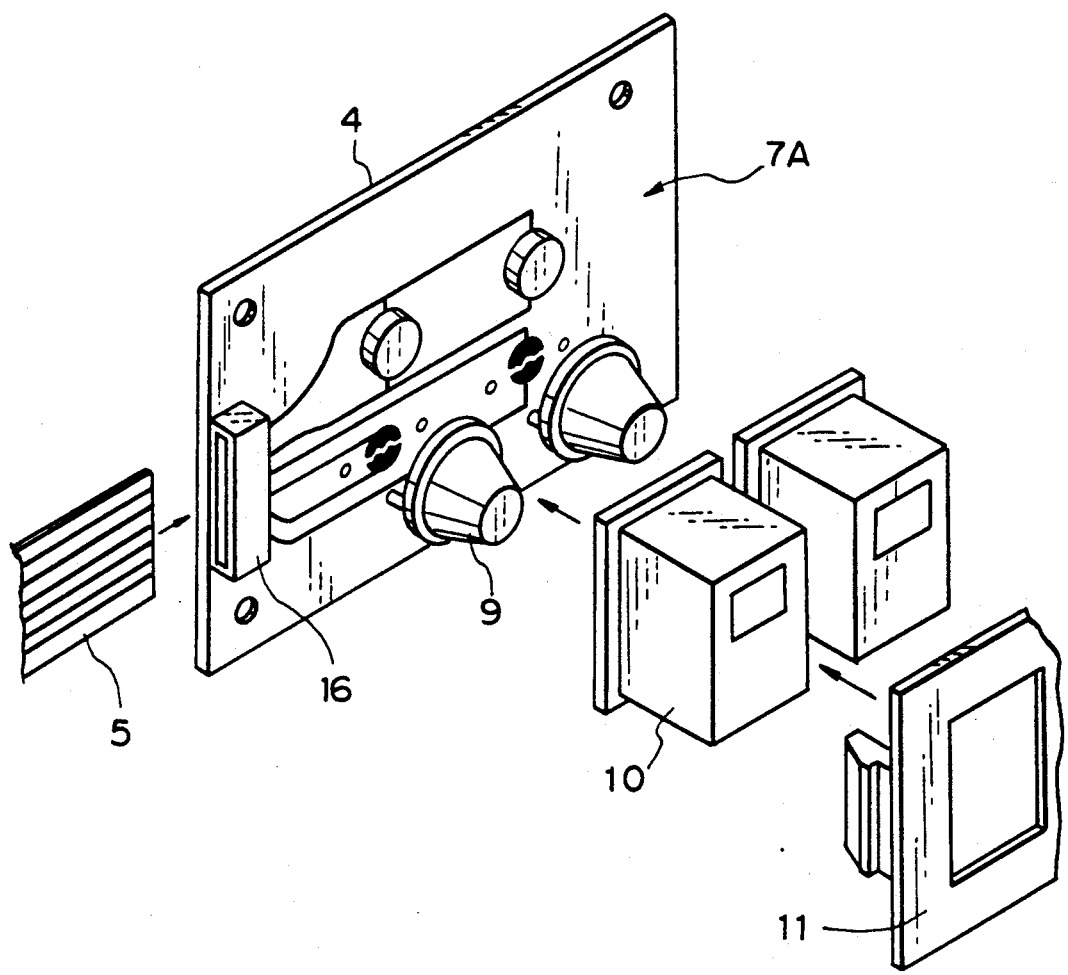
FIG. 7 is a partially enlarged perspective view of another modification of the electric circuit structure of FIG. 3.

The electric circuit of the cluster 2 is formed by FFC 5, the control unit 17 and the rigid sheet-like wiring boards 7A to 7E, the end 12 of FFC 5 of the cluster 2 is designed to be connected to the body of an automobile or to the main lines of the instrument panel portion 1, the rigid sheet-like wiring board 7A and FFC 5 may be releasably connected to each other, instead of by virtue of direct connecting by soldering as shown in FIG. 6, by means of a connector 16 provided on the rigid sheet-like wiring board 7A as shown in FIG. 7.

In the electric circuit structure of the second embodiment, for instance, replacing a conventional complicated structure such as a heart cam or the like, a simple push-switch is used for the self-hold type switch, and this helps reduce the cost, size and weight of the switch, and also improves the assembling efficiency. Therefore, the electric circuit structure of the cluster 2 is simplified, and for instance, if the circuit portion of the control unit 17 is formed into a multi-layered substrate, since it is possible to easily carry out the joint and jumper of circuits within the multi-layered substrate, the flow of the circuit pattern between the control unit 17 and the switches and instruments is improved to a remarkable extent, and it is possible to connect everything using parallel circuits. In this structure, FFC 5 may be laid out on one side and in a single layer, and ribbon cables may also be employed, whereby it is possible to further simplify the circuit structure, leading to lighter weight and lower cost.

Figure 8:
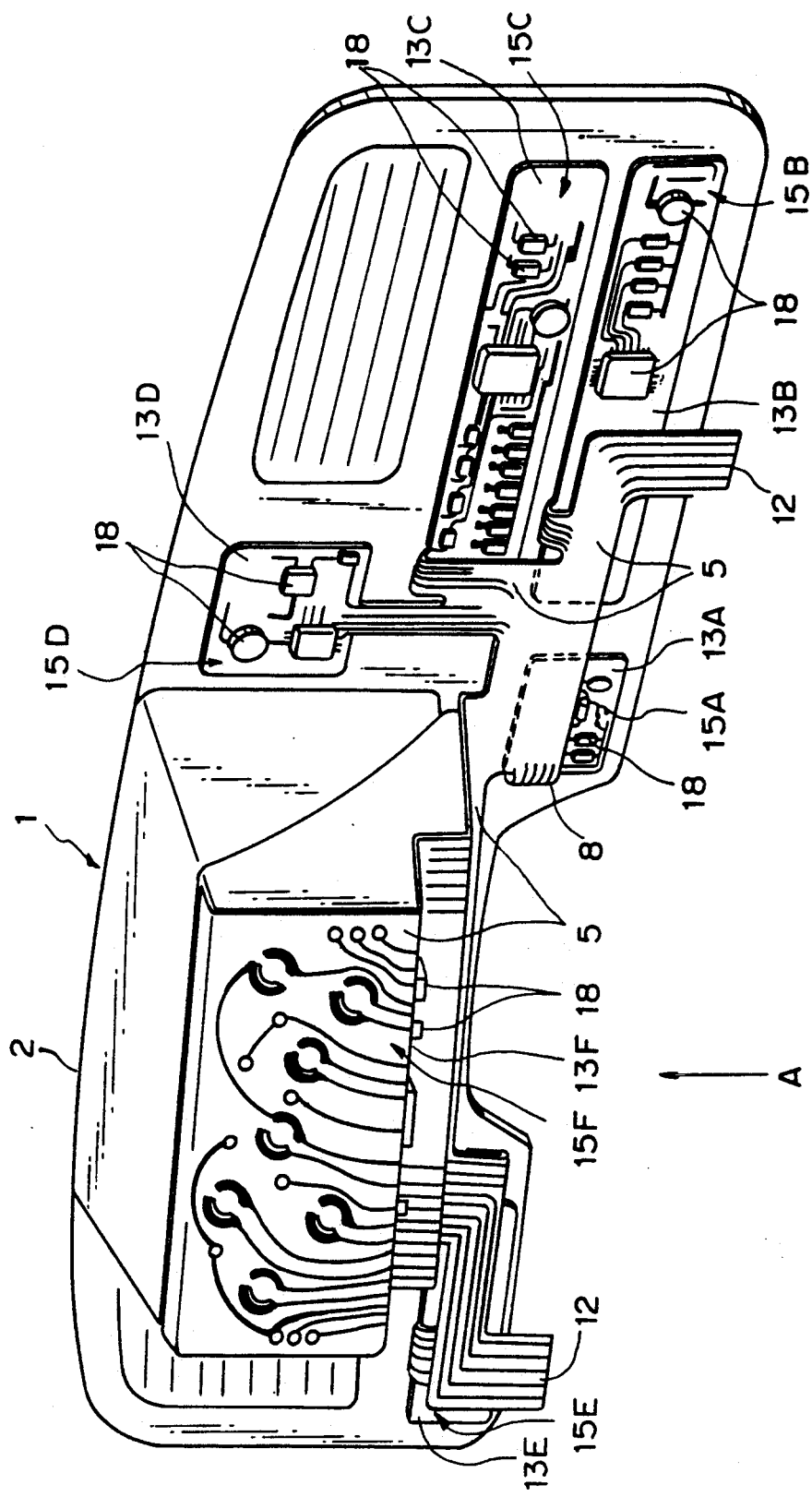
FIG. 8 is a view similar to FIG. 1, which shows a third embodiment of the present invention.
Figure 9:
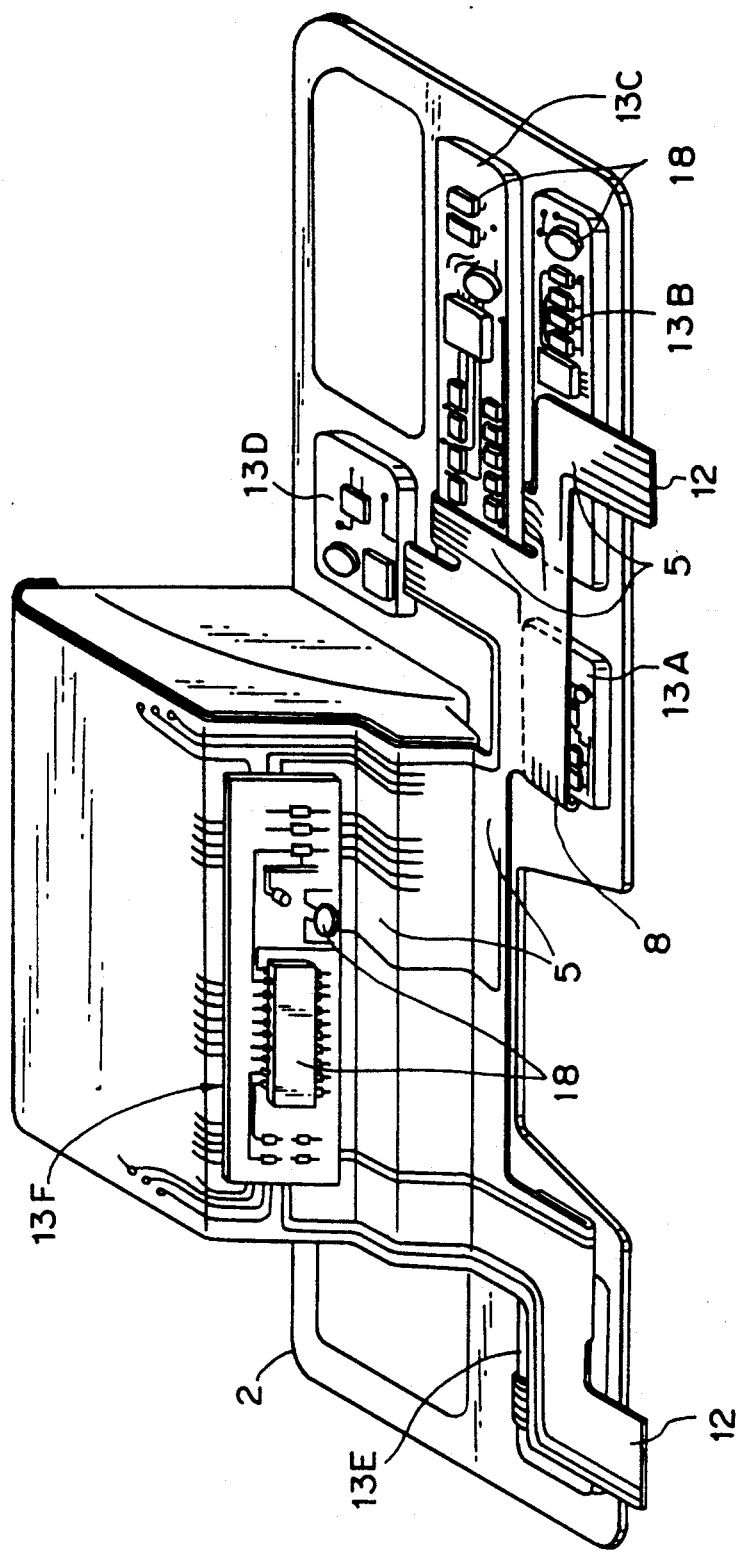
FIG. 9 is a view similar to FIG. 5, which shows the third embodiment of the present invention.
Figure 10:
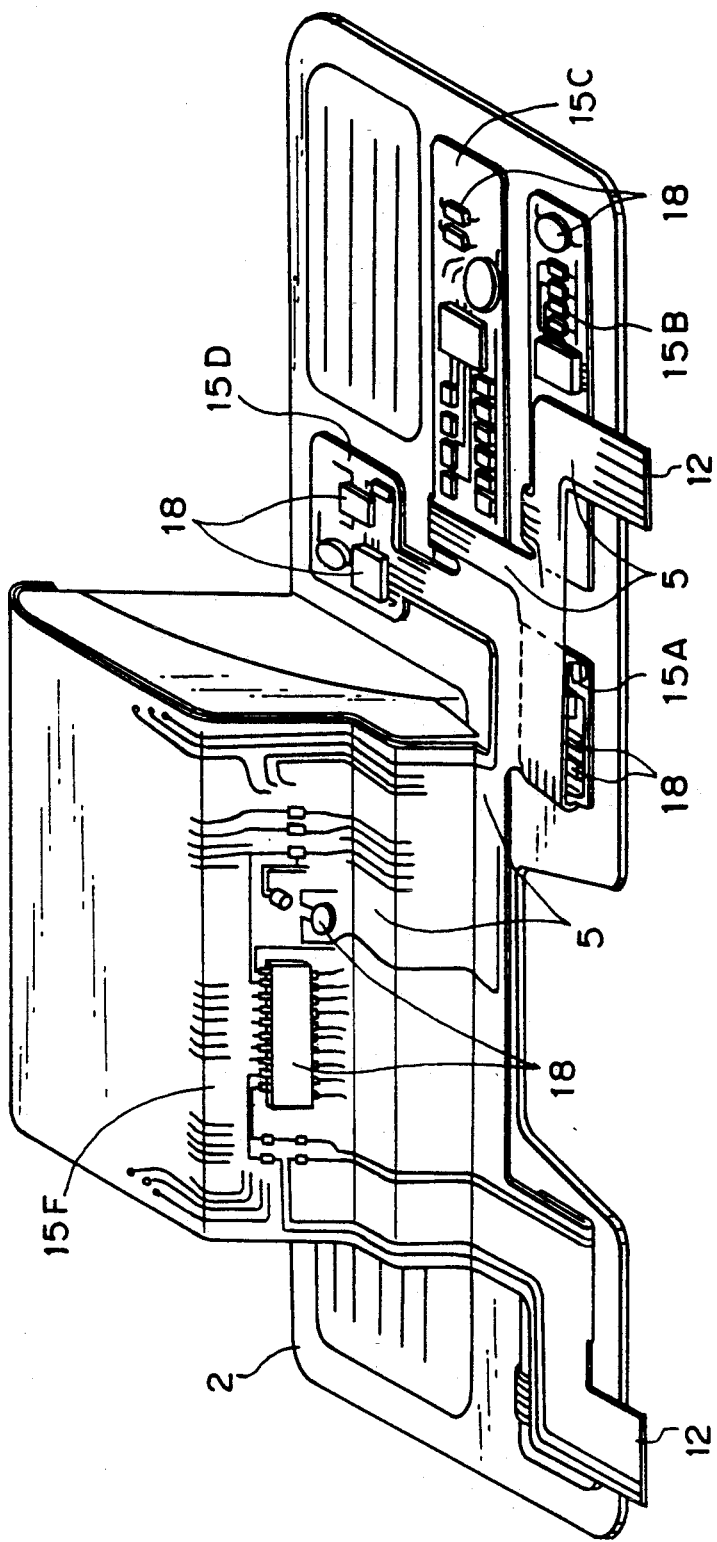
FIG. 10 is a view similar to FIG. 5, which shows a fourth embodiment of the present invention.

Next, referring to FIGS. 8 and 9, a third embodiment of the present invention will be described.

As in the case of the above embodiment, in the cluster 2 in which FFC 5 is affixed thereon in such a manner as to follow the recessed and/or raised surface thereof so as to form electric circuits for the switches and instruments 3A to 3F, at the end portion of the electric circuits for the switches and instruments 3A to 3F that are provided on the back of the cluster 2 the electric functioning components 18 for memories and operations that are needed to perform electric control functions of the switches and instruments 3A to 3F are dispersedly provided, and electric control substrates 13A to 13F are incorporated in the respective end circuits are mounted, respectively. The electric control substrates 13A to 13F and the connecting portion 8 of FFC 5 are integrally direct connected to each other. For instance, as shown in FIG. 3, the connecting portion 8 of FFC 5 having the electricity conducting portion on the surface that is not brought into contact with the back of the cluster 2 is fastened around the end of the electric control substrate 13A having an electricity conducting portion 6 for the end circuit of the switches and instruments on the back and jointing surface so as to be fixedly soldered, whereby the electricity conducting portions 6 of the both members are connected to each other, and thus the functioning circuit of the electric functioning components 18 is incorporated into and connected to the electric circuit of FFC 5. The rubber switch 9, key top 10 and switch frame 11 are mounted on the electric control substrate 13A in that order with the rubber switch 9 being direct connected to the electricity conducting portion 6 so as to function as a switch.

The electric control substrates 13A to 13F are constructed such that the electric functioning components 18 needed as an electric control function for the electric circuit of FFC 5 are dispersedly provided therein so as to be integral with the respective switches and instruments 3A to 3F, and the electric control substrates 13A to 13F that are incorporated in FFC 5 for connection are connected to each other in such a manner that multi-communication is possible, the electric circuit of the cluster 2 being thereby formed. The connecting portion 12 at the end of FFC 5 of the cluster 2 is designed to be connected to the body of an automobile or to the main lines of the instrument panel portion 1. This cluster also constitutes an independent electric component.

In the present invention, the rigid sheet 4 is not necessarily used for the electric control substrates 13A to 13F. However, the end circuits of the switches and instruments 3A to 3F should be designed to be integral with the electric functioning components 18. The electric control substrates 13A to 13F and FFC 5 may be connected together by means of the connector 16 as shown in FIG. 7.

Figure 11:
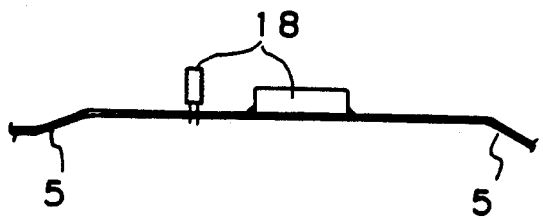
FIG. 11 is a view similar to FIG. 6, which shows the fourth embodiment of the present invention.
Figure 12:
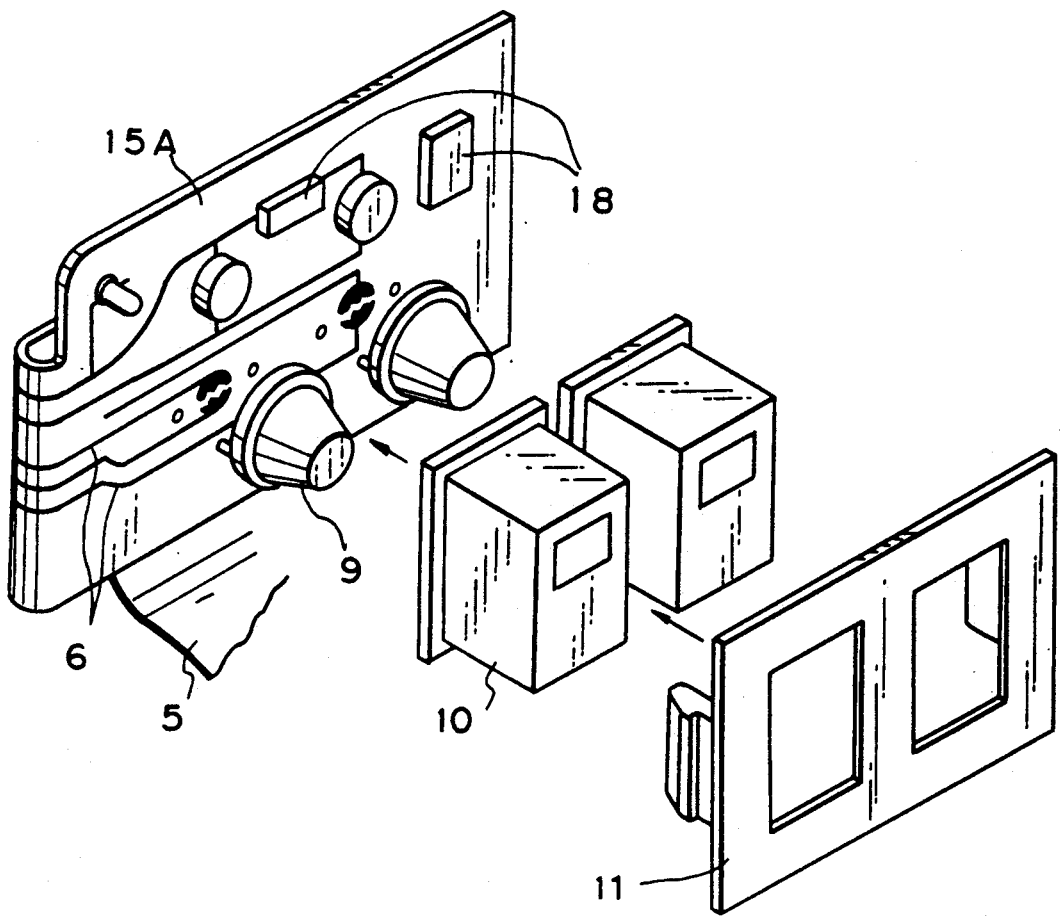
FIG. 12 is a view similar to FIG. 3, which shows the fourth embodiment of the present invention.

Referring to FIG. 8 and FIGS. 10 to 12, a fourth embodiment of the present invention will be described. In the cluster 2 in which FFC 5 is affixed thereto so as to form electric circuits for the switches and instruments 3A to 3F, the electric functioning components 18 needed for electric control functions for memories, operation and so forth of the switches and instruments 3A to 3F are provided on FFC 5 for the respective switches and instruments 3A to 3F. To be specific, as shown in FIG. 12, the end portion 15A of the electric circuit of the switch and instrument 3A of FFC 5 is bent through 180 degrees, and as shown in FIG. 11, the functioning components 18 such as an IC are mounted on the end portion 15A by soldering, and the rubber switch 9, key top 10 and switch frame 11 are mounted on the end portion of the electricity conducting portion 6 thereof in that order with the rubber switch 9 and the electricity conducting portion 6 being direct connected to each other, and a control circuit for the electric functioning components 18 is incorporated into the circuit of FFC 5.

The electric functioning components 18 so mounted are connected to each other between the end portions 15A to 15F in such a manner that multi-communication is possible. The end portion 15 is not necessarily bent, and for instance, in the switch and instrument 7D (FIG. 1), the electric functioning component 18 may be mounted on the end portion 15D which extends straight. Thus, FFC 5 is affixed on the back of the cluster 2, while the switches and instruments 3A to 3F are mounted from the front of the cluster 2 so as to form electric circuits having electric control functions. The connecting portion 12 at the end of FFC 5 is designed to be connected to the body of an automobile or to the main lines of the instrument panel portion 1. The cluster 2 of this embodiment also constitutes an independent electric component.

Figure 13:
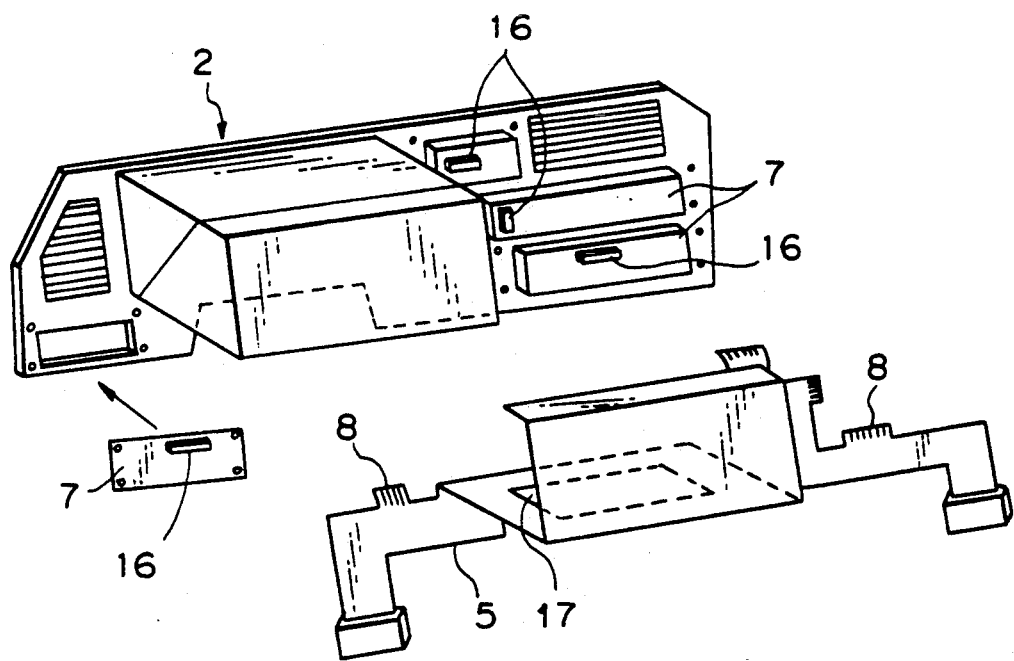
FIG. 13 is an exploded perspective view of the back of an instrument cluster showing a forming method according to the present invention.

FIG. 13 illustrate a method for forming electric circuits for the instrument panel portion 1 employing the cluster 2 described as an independent electric component in the above embodiments. In other words, for instance, the switches and instruments are mounted on the cluster 2 in advance, while the rigid sheet-like wiring boards 7 having the connector 16 for FFC are mounted, respectively, on the back of the switches and instruments that are divided into groups. Following this, FFC 5 having the control unit 17 incorporated therein is affixed along the wall of the back of the cluster 2. The connecting portion 8 of FFC 5 is connected to the connector 16 for FFC so as to make the cluster 2 an independent electric component. This cluster 2 is then mounted on the dashboard (not shown) of the instrument panel portion 1 so as to form electric circuits for the instrument panel portion 1. The cluster 2 according to the forming method of this embodiment may be tested as an independent electric component in advance in relation to electricity conduction, and moreover, it is possible to produce the cluster 2 only on a large scale. This forming method may be adopted not only for the embodiment shown in FIG. 13 but also for the other embodiments such as the one shown in FIG. 1.

Although not shown, in the above invention employing FFC 5, FFC 5 may be used that are formed so as to have a curvature that coincides with the recessed and/or raised configuration of the wall surface of the cluster 2. In addition, a wiring harness may be used for FFC 5 in order to form electric circuits.

In the electric circuit structure for the instrument panel portion for an automobile according to the present invention, in a case in which FFC 5 is used, space required for a circuit can be drastically reduced when compared with a case in which an electric circuit is formed by using a wiring harness having a conventional structure, and therefore it is possible to save remarkable omaints of space. Moreover, it is possible not only to further simplify the structure of the electric circuit but also to reduce the weight of the instrument panel portion. Furthermore, since the electric circuit is formed by disposing wiring boards each comprising a flexible sheet body, workability and productivity in forming electric circuits can be remarkably improved. In addition, the quality and performance of electric circuits so formed is improved on the basis of the following technical merits inherent in FFC 5: there is no wiring error; automatic formation is possible; and the heat dissipation area of a circuit is made larger to thereby make it possible to use a great magnitude of unit sectional area current. The electric circuit structure of the present invention is also advantageous in that it will be able to fully meet requirements made in the future when high density and high grade electric circuits are required for an instrument panel portion.

Furthermore, since the electric functioning components needed to carry out electric control of groups of switches and instruments are incorporated in the electric circuits of the cluster 2, the electric circuit structure is further simplified and the size thereof is made smaller by adopting multi-functioning switches and multi-communications, and the quality thereof is also improved. In the forming method and circuit structure of the present invention, the cluster 2 of an independent single-unit electric component is checked in relation to electricity conduction in advance so as to secure the quality thereof, whereby a failure in electricity conduction in the instrument panel portion is prevented in advance, thereby making it possible to improve the quality thereof. In addition, rationalization of production of automobile instrument panel portions and improvement in productivity in assembling instrument panel portions can be accelerated.

What is claimed is:

1. An electric circuit panel structure for an instrument panel of an automobile, the instrument panel including an instrument cluster comprising a plurality of switches and instruments, said electric circuit panel structure comprising:
   a flexible flat conductor wiring board; and
   electric circuits provided on said board, wherein the switches and instruments are electrically connected to said electric circuits provided on said flexible flat conductor wiring board, and wherein the instrument cluster includes a plurality of recesses and raised surfaces, said flexible flat conductor wiring board being affixed to and conforming with the plurality of recesses and raised surfaces formed on the instrument cluster.

2. The electric circuit panel structure as set forth in claim 1, wherein the switches and instruments and said electric circuits of said flexible flat conductor wiring board are in direct electrical contact.

3. The electric circuit panel structure as set forth in claim 1, wherein the switches and instruments include electric circuit portions formed into a rigid sheet-like wiring board, and wherein said electric circuit portions are electrically connected to said electric circuits of said flexible flat conductor wiring board.

4. An electric circuit panel structure for electrically connecting switches and instruments associated with an instrument cluster of an instrument panel of an automobile, said electric circuit panel structure comprising:
   a flexible flat conductor wiring board;
   electric circuits provided on said wiring board, wherein the switches and instruments are electrically connected to said electric circuits provided on said flexible flat conductor wiring board;
   a centralized control unit;
   electric control elements provided on said centralized control unit for controlling the switches and instruments, wherein said electric control elements provided on said centralized control unit are electrically connected with said electric circuits of said flexible flat conductor wiring board.

5. The electric circuit panel structure as set forth in claim 4, further comprising:
   a plurality of electric control substrates associated with respective ones of the switches and instruments, wherein said electric control elements are also provided on said electric control substrates and in electrical contact with said electric circuits of said flexible flat conductor wiring board.

6. The electric circuit panel structure as set forth in claim 5 or claim 5 wherein said flexible flat conductor wiring board and said control unit, or said flexible flat conductor wiring board and said electric control substrates are fixedly attached to each other.

7. The electric circuit panel structure as set forth in any of claims 1, 2, 3, 4 or 5, wherein the switches and instruments are electrically connected to each other via said electrical circuits of said flexible flat conductor wiring board, to permit multi-communication between the switches and instruments.

8. The electric circuit panel structure as set forth in claims 4 or 5, wherein said flexible flat conductor wiring board exhibits a curved configuration that coincides with a configuration of a wall of the instrument cluster.

9. A method for forming an electric circuit panel structure for an instrument panel of an automobile including an instrument cluster comprising a plurality of groups of switches and instruments, said method comprising the steps of:
   providing rigid sheet-like wiring boards for each of the groups of switches and instruments;
   providing an electrical connector on each of said rigid sheet-like wiring boards;
   mounting said rigid sheet-like boards on a rear portion of the instrument cluster;
   providing a flexible flat conductor wiring board, including a control unit incorporated therein;
   providing a predetermined pattern of electrical circuits on said flexible flat conductor;
   mounting said flexible flat conductor wiring board on a rear portion of the instrument cluster;
   connecting said electrical connectors on said rigid sheet-like wiring boards to said electrical circuits on said flexible flat conductor wiring board, so as to make the instrument cluster an independent electric component; and
   mounting the instrument cluster on the instrument panel.

10. The method for forming an electric circuit panel as set forth in claim 9, further comprising the step of:
    forming said flexible flat conductor wiring board so that said flexible flat conductor wiring board exhibits a shape which conforms and coincides with a plurality of recessed and raised surfaces of the instrument cluster.

11. An electric circuit panel structure for an instrument panel portion of an automobile, the instrument panel including an instrument cluster comprising a plurality of switches, instruments and control circuitry, said electric panel structure comprising:
    a flexible flat conductor wiring board; and
    electric circuits provided on said flexible flat conductor wiring board for electrically connecting the switches and instruments, and wherein the instrument cluster is an independent electric component so that the instrument cluster can be assembled and tested prior to being mounted in the instrument panel.

* * * * *